(12) United States Patent
Dohner et al.

(10) Patent No.: US 11,749,787 B2
(45) Date of Patent: Sep. 5, 2023

(54) FORMING A MULTICOLOR PHOSPHOR-CONVERTED LED ARRAY

(71) Applicant: Lumileds LLC, San Jose, CA (US)

(72) Inventors: Emma Dohner, Redwood City, CA (US); Kentaro Shimizu, Sunnyvale, CA (US); Hisashi Masui, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/719,793

(22) Filed: Apr. 13, 2022

(65) Prior Publication Data
US 2022/0238767 A1  Jul. 28, 2022

Related U.S. Application Data

(60) Division of application No. 17/718,811, filed on Apr. 12, 2022, which is a continuation of application No.
(Continued)

(30) Foreign Application Priority Data

Feb. 17, 2020 (EP) .................................. 20157722

(51) Int. Cl.
*H01L 33/00* (2010.01)
*H01L 25/075* (2006.01)
*H01L 33/50* (2010.01)

(52) U.S. Cl.
CPC ........ *H01L 33/504* (2013.01); *H01L 25/0753* (2013.01); *H01L 33/005* (2013.01); *H01L 33/0095* (2013.01); *H01L 2933/0041* (2013.01)

(58) Field of Classification Search
CPC ... H01L 25/0753; H01L 25/75; H01L 25/167; H01L 33/504; H01L 33/505;
(Continued)

(56) References Cited

U.S. PATENT DOCUMENTS 8,546,159 B2  10/2013  Yoo et al.
11,063,191 B2  7/2021  Dohner et al.
(Continued)

FOREIGN PATENT DOCUMENTS

EP   2610058 A1   7/2013
WO   9748138 A2   12/1997
(Continued)

OTHER PUBLICATIONS

From the EPO as the ISA, "Notification of Transmittal of the International Search Report and the Written Opinion of the International Searching Authority, or the Declaration", PCT/US2020/055729, dated Jan. 28, 2021, 17 pages.
(Continued)

*Primary Examiner* — Nikolay K Yushin (57) ABSTRACT

An array of phosphor pixels is positioned on an array of semiconductor LED pixels with thermally curable adhesive between them. Selected LED pixels of the array are electrically activated; resulting heat cures the adhesive to attach the corresponding phosphor pixel to the activated LED pixel and to release the corresponding phosphor pixel from a carrier. Removal of the carrier removes unattached phosphor pixels, leaving behind phosphor pixels attached to the LED pixels that were activated. The process can be repeated for phosphor pixels of different colors.

18 Claims, 11 Drawing Sheets

Related U.S. Application Data

PCT/US2020/055729, filed on Oct. 15, 2020, which is a continuation-in-part of application No. 16/653,414, filed on Oct. 15, 2019, now Pat. No. 11,063,191.

(58) Field of Classification Search
CPC ..... H01L 33/0095; H01L 33/60; H01L 33/62; H01L 2933/0041; H01L 2933/091; H01L 2933/0066; H01L 2933/0091; H01L 2933/0075

See application file for complete search history.

(56) References Cited

U.S. PATENT DOCUMENTS

| | | |
|---|---|---|
| 2011/0014732 A1 | 1/2011 | Lee |
| 2012/0052608 A1 | 3/2012 | Yoo et al. |
| 2015/0171287 A1 | 6/2015 | Matsumura et al. |
| 2017/0263826 A1 | 9/2017 | Huska et al. |
| 2017/0294563 A1 | 10/2017 | Hashimoto |
| 2019/0237637 A1 | 8/2019 | Cheng et al. |

FOREIGN PATENT DOCUMENTS

| | | |
|---|---|---|
| WO | 2012032052 A1 | 3/2012 |
| WO | 2014016299 A1 | 1/2014 |
| WO | 2015/004577 A1 | 1/2015 |
| WO | 2021/076724 A1 | 4/2021 |

OTHER PUBLICATIONS

Extended European Search Report, EP Application No. 20157722.8, dated Jul. 16, 2020, 9 pages.

Hu et al., "Improving transparency of stretched PET/MXD6 blends by modifying PET with iso phthalate", 2005, Polymer 46 (2005) 5202-5210 (published May 5, 2005).

Dohner et al., "Forming a Multicolor Phosphor-Converted LED Array", U.S. Appl. No. 17/718,811, filed Apr. 12, 2022, 34 pages (Parent application).

FORMING A MULTICOLOR PHOSPHOR-CONVERTED LED ARRAY

BENEFIT CLAIMS TO RELATED APPLICATIONS

This application is a divisional of U.S. application Ser. No. 17/718,811 filed 12 Apr. 2022, which is a continuation of App No PCT/US2020/055729 filed 15 Oct. 2020, which in turn claims priority of U.S. application Ser. No. 16/653,414 filed 15 Oct. 2019 (now U.S. Pat. No. 11,063,191) and EP App No 20157722.8 filed 17 Feb. 2020. Each one of said applications is incorporated by reference in its entirety.

FIELD OF THE INVENTION

The invention relates generally to phosphor-converted light emitting diodes (LEDs).

BACKGROUND

Red-Green-Blue (RGB) microLED displays are expected to be the next generation of display technology, due to superior image quality, lower power consumption, and increased reliability. Currently, several methods exist to form large arrays of multi-color, micron-scale, and closely spaced pixels. One option is to assemble each pixel from individual red, green, and blue LED dice. Another option is to pattern red and green subpixels onto a blue pixelated die, either via a stamp process, photolithography, or ink-jet printing.

SUMMARY

A method for making a light emitting apparatus comprises positioning a phosphor structure on a semiconductor LED array, and selectively operating selected ones of the multiple semiconductor LED pixels that constitute the array. The phosphor structure includes multiple phosphor pixels and is positioned so that each phosphor pixel is aligned with a corresponding semiconductor LED pixel of the array. The phosphor structure has a layer of thermally curable adhesive thereon; with the phosphor structure positioned on the semiconductor LED array, a corresponding segment of the adhesive is between and in contact with each phosphor pixel and a light output surface of the corresponding semiconductor LED pixel. Electrically operating selected ones of the semiconductor LED pixels causes those pixels to emit light and to heat the corresponding phosphor pixels to a temperature that at least partially cures corresponding discrete segments of the adhesive. Thermal curing of the adhesive bonds each one of the selected semiconductor LED pixels to the corresponding phosphor pixel.

The method can further include positioning a second phosphor structure on the semiconductor LED array, and selectively operating selected ones of the multiple semiconductor LED pixels of the second array. The phosphor pixels of the first phosphor structure are all of a first color; the second phosphor structure includes multiple phosphor pixels all of a second color different from the first color. The second phosphor structure is positioned on the semiconductor LED array and the bonded phosphor pixels of the first color, with each phosphor pixel of the second color aligned with a corresponding semiconductor LED pixel of the array that is not bonded to a phosphor pixel of the first color. The second phosphor structure has a layer of thermally curable adhesive thereon; with the second phosphor structure positioned on the semiconductor LED array, a corresponding segment of the adhesive is between and in contact with each phosphor pixel of the second color and the corresponding semiconductor LED pixel. Electrically operating selected ones of the semiconductor LED pixels causes those pixels to emit light and to heat the corresponding phosphor pixels of the second color to a temperature that at least partially cures corresponding discrete segments of the adhesive. Thermal curing of the adhesive bonds each of the selected semiconductor LED pixels to the corresponding phosphor pixel of the second color.

A light emitting apparatus includes the semiconductor LED array with multiple semiconductor LED pixels, multiple corresponding phosphor pixels of multiple different colors, and multiple discrete segments of thermally cured adhesive. Each phosphor pixel is positioned over a light emitting surface of a corresponding one of the semiconductor LED pixels. Between each phosphor pixel and the corresponding semiconductor LED pixel is a corresponding discrete segment of the thermally cured adhesive that attaches the phosphor pixel to the corresponding semiconductor LED pixel. Each discrete segment of thermally cured adhesive is separated from other discrete segments of thermally cured adhesive between other phosphor pixels and corresponding semiconductor LED pixels of the array.

Objects and advantages pertaining to phosphor-converted light emitting diodes (LEDs) may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, the relative height, depth, or width of various layers or structures of the LED array, each LED pixels, or phosphor layers or pixels often can be exaggerated relative to others, e.g., the thickness of an underlying substrate. The embodiments shown are only examples and should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the disclosure or appended claims. The detailed description illustrates by way of example, not by way of limitation, the inventive principles of the present disclosure and appended claims.

The term "GaN LED" is used herein to refer to III-Nitride LEDs, i.e., to LEDs formed in the AlInGaN material system. The examples below are describe with reference to such GaN LEDs, but the methods described herein may be used with III-Phosphide (AlInGaP material system) LEDs or with LEDs formed in any other suitable material system.

This disclosure describes a monolithic approach to manufacturing a high density patterned or multi-color phosphor converted LED array 10, without serial pick and place steps for every single pixel. This avoids the significant attach accuracy issues of serial pick and place, which leads to wide gaps between neighboring pixels. Unlike stamp-based approaches, there is no additional patterning step required before the attach process—color selectivity occurs during phosphor integration. By using a monolithic approach and a one-step per color attach, accuracy can be enhanced. Additionally, yield improvements can be addressed by incorporating a small number of error correction steps in the phosphor placement process.

In the methods disclosed herein, a layered carrier assembly includes, in order, a substrate 30 (e.g., PET), a thermal or UV activated release adhesive 32, a layer containing a segmented (pixelated) phosphor array, and a partially cured or highly viscous silicone adhesive 20. The phosphor pixels 18 on a carrier 30 are typically all of the same color. In many display applications the assembled array will include phosphor pixels 18 of different colors. Phosphor pixels 18 of all colors are referred to generically or collectively herein as phosphor pixels 18, while phosphor pixels of specific colors are referred to as phosphor pixels 18R (red), 18G (green), and 18B (blue) in an RGB display color scheme. Other colors, numbers of colors, or combinations of colors can be used for the phosphor pixels 18.

In formation of a phosphor converted LED array by these methods, the phosphor pixels 18 on the layered carrier assembly are aligned with and placed in contact with corresponding semiconductor LED pixels 14 in an array of pixelated semiconductor LED dice, which may for example have a Thin-Film Flip Chip (TFFC) architecture. Selected phosphor pixels 18 on the carrier assembly may then be attached to corresponding semiconductor LED pixels 14, and released from the substrate, by powering (activating) the corresponding semiconductor LED pixels 14 to heat the selected phosphor pixel 18 to a desired temperature. This releases the thermal release adhesive 32 attaching the selected phosphor pixels 18 to the carrier substrate 30 and cures or partially cures the adhesive 20 on the selected phosphor pixels 18 in contact with the corresponding semiconductor LED pixels 14. Thus, the step of attaching selectively bonds pixels 18 of the phosphor layer to corresponding pixels 14 of the array of pixelated semiconductor LED dice. The layered carrier assembly and un-bonded phosphor pixels 18 may then be removed, for example with a process tape attached (e.g., laminated) to a backside of the substrate 30.

If a UV release adhesive 32 is used instead of or in addition to the thermal release adhesive, then UV light emitted by a GaN LED may release the corresponding phosphor pixel 18 from the carrier 30.

This process may be repeated with phosphor pixel arrays of different colors to produce a multicolor phosphor converted LED array 10. The final device structure may be further heated such that the silicone adhesive strongly bonds the phosphor pixels 18 to the semiconductor LED pixels 14.

By using a pre-formed phosphor layer, the color control and yield can be highly controlled by pre-testing and selecting only known-good-phosphor for integration.

Figure 1A:
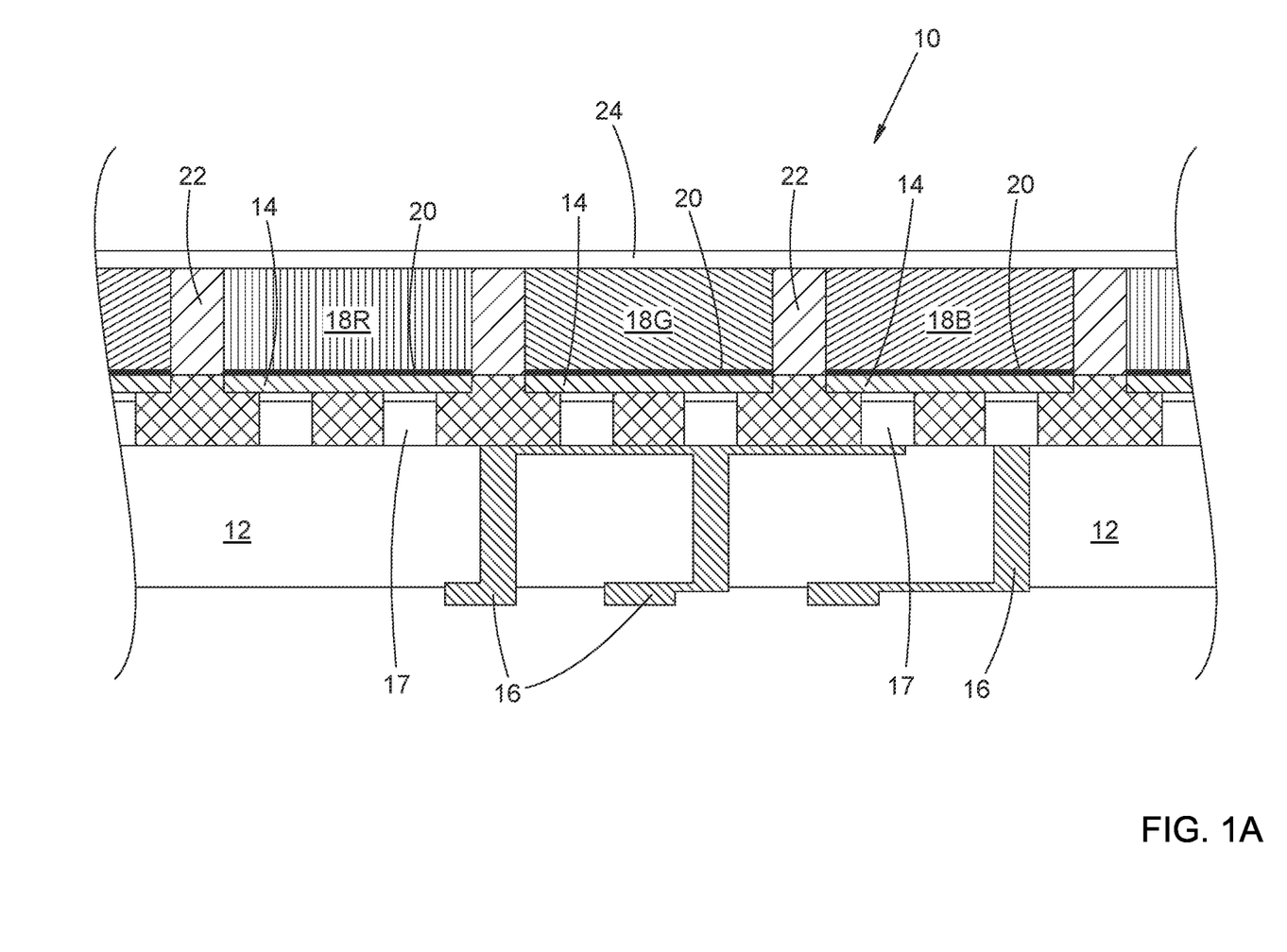
FIG. 1A is a side cross-sectional schematic diagram of an example of a close-packed array of multi-colored phosphor-converted LEDS on a monolithic die and substrate.

FIG. 1A is a schematic cross-sectional view of a close packed array 10 of multi-colored, phosphor converted LEDs on a monolithic die and substrate 12, prepared by the methods disclosed herein. The side view shows GaN LEDs 14 attached to the substrate 12 through metal interconnects 17 (e.g., gold-gold interconnects or solder attached to copper micropillars) and metal interconnects 16. Phosphor pixels 18 are attached to corresponding GaN LEDs 14 though an adhesive layer 20, which may be a silicone adhesive layer for example. The pixels 18 of the phosphor array can be coated on their sides with a reflective mirror or diffusive scattering layer 22. In some examples the phosphor pixels 18 can be the same height and the same single color; in some examples the phosphor pixels can be of varying heights/thicknesses or differing colors. In multi-color devices (based on the desired color point) differing phosphor thicknesses facilitates the sequential nature of the phosphor attach process; typically phosphor pixels 18 of the last color attached will be the thickest (tallest). In some examples an optional buffer or clear layer 24 can be disposed on top of the phosphor pixels 18. Such a buffer or clear layer 24 can help to maintain the color point, can even out any thickness or height variation among the phosphor pixels 18, or protect the phosphor pixels during subsequent processing steps (e.g., removing excess material applied as a reflective side coating to the phosphor pixels 18).

As summarized above and further explained below with reference to the figures, self-heating of the semiconductor LED pixels 14 and corresponding phosphor pixels 18 during operation of the semiconductor LED dice is used to selectively bond pixels 18 from a phosphor array to corresponding GaN LED pixels 14 to form the phosphor converted LED array.

In some examples of display applications, an LED display includes a multitude of display pixels. In some examples (e.g., as in FIG. 1B), each display pixel comprises a single semiconductor LED pixel 14 and a corresponding phosphor pixel 18R, 18G, or 18B of a single color (red, green, or blue). Each display pixel only provides one of the three colors. In some examples (e.g., as in FIG. 1C), each display pixel includes multiple semiconductor LED pixels 14 and multiple corresponding phosphor pixels 18 of multiple colors. In the example shown each display pixel includes a 3×3 array of semiconductor pixels 14; three of those LED pixels have red phosphor pixels 18R, three have green phosphor pixels 18G, and three have blue phosphor pixels 18B. Each display pixel can therefore produce any desired color combination. In the example shown the spatial arrangement of the different colored phosphor pixels 18 differs among the display pixels; in some examples (not shown) each display pixel can have the same arrangement of the different colored phosphor pixels 18.

Figure 2:
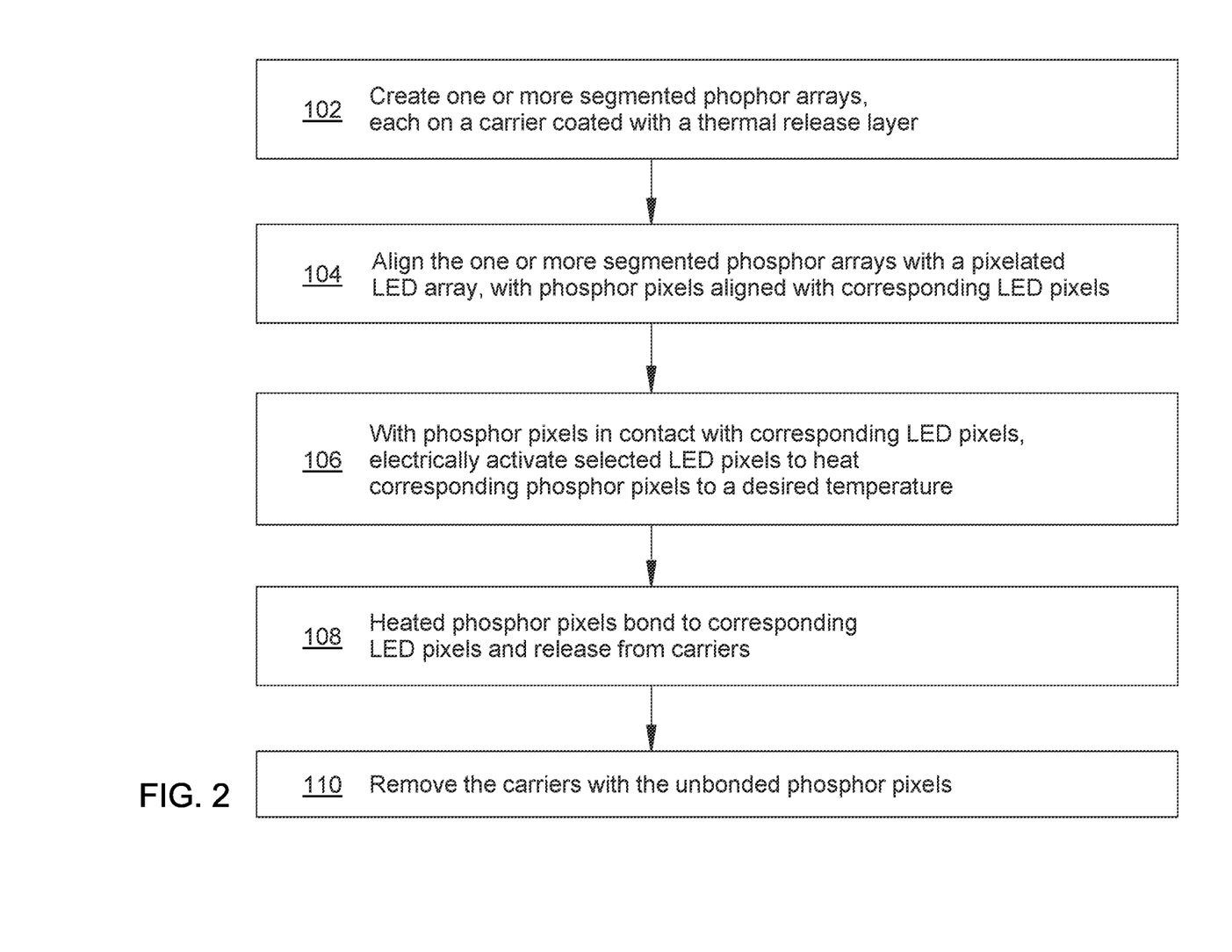
FIG. 2 is a process flowchart of an example of a disclosed method.
Figure 3A:
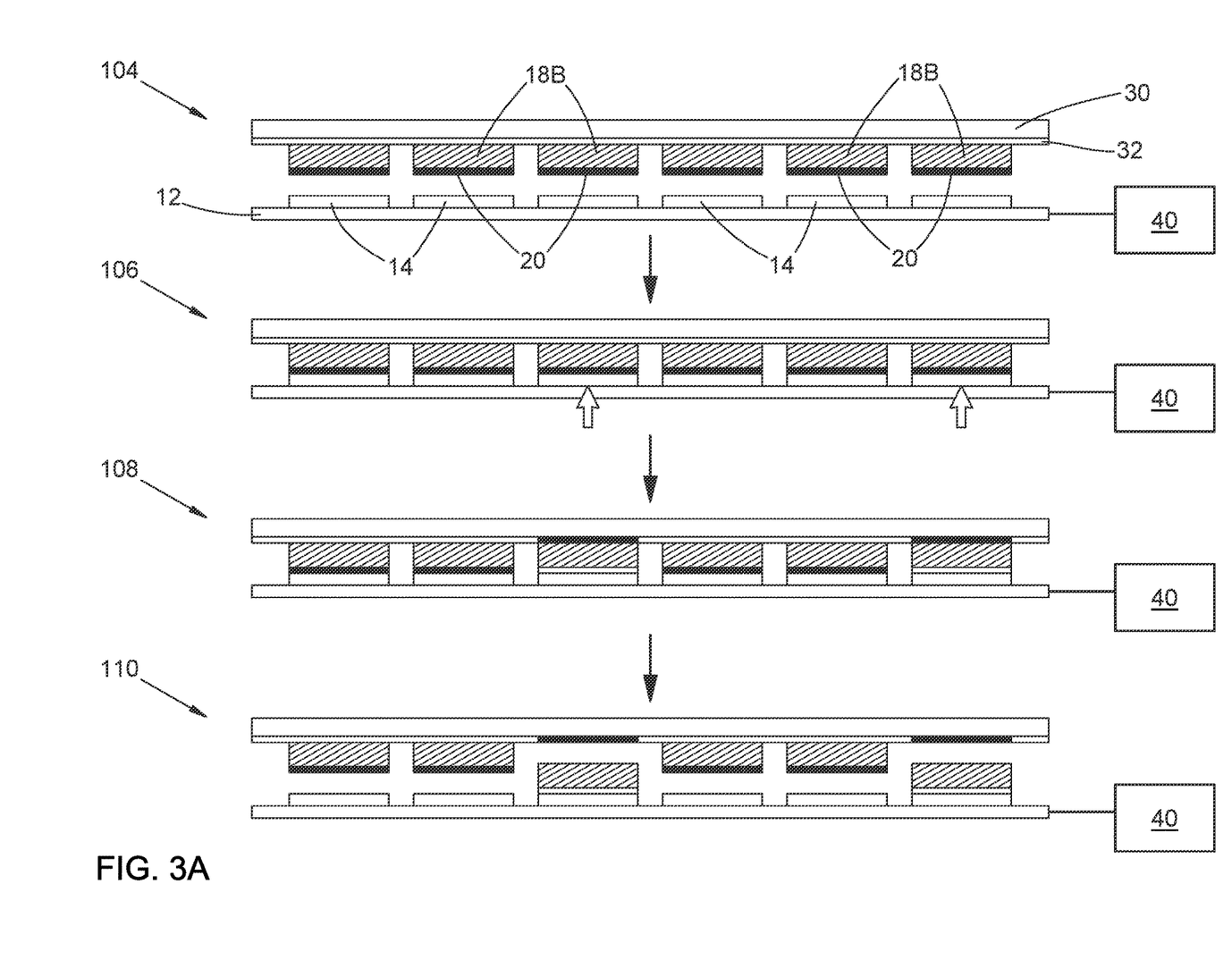
FIGS. 3A, 3B, and 3C are side cross-sectional diagrams that schematically illustrate position-selective, color-sequenced attachment of phosphor pixels of three different colors to a semiconductor LED array according to an example method.
Figure 3B:
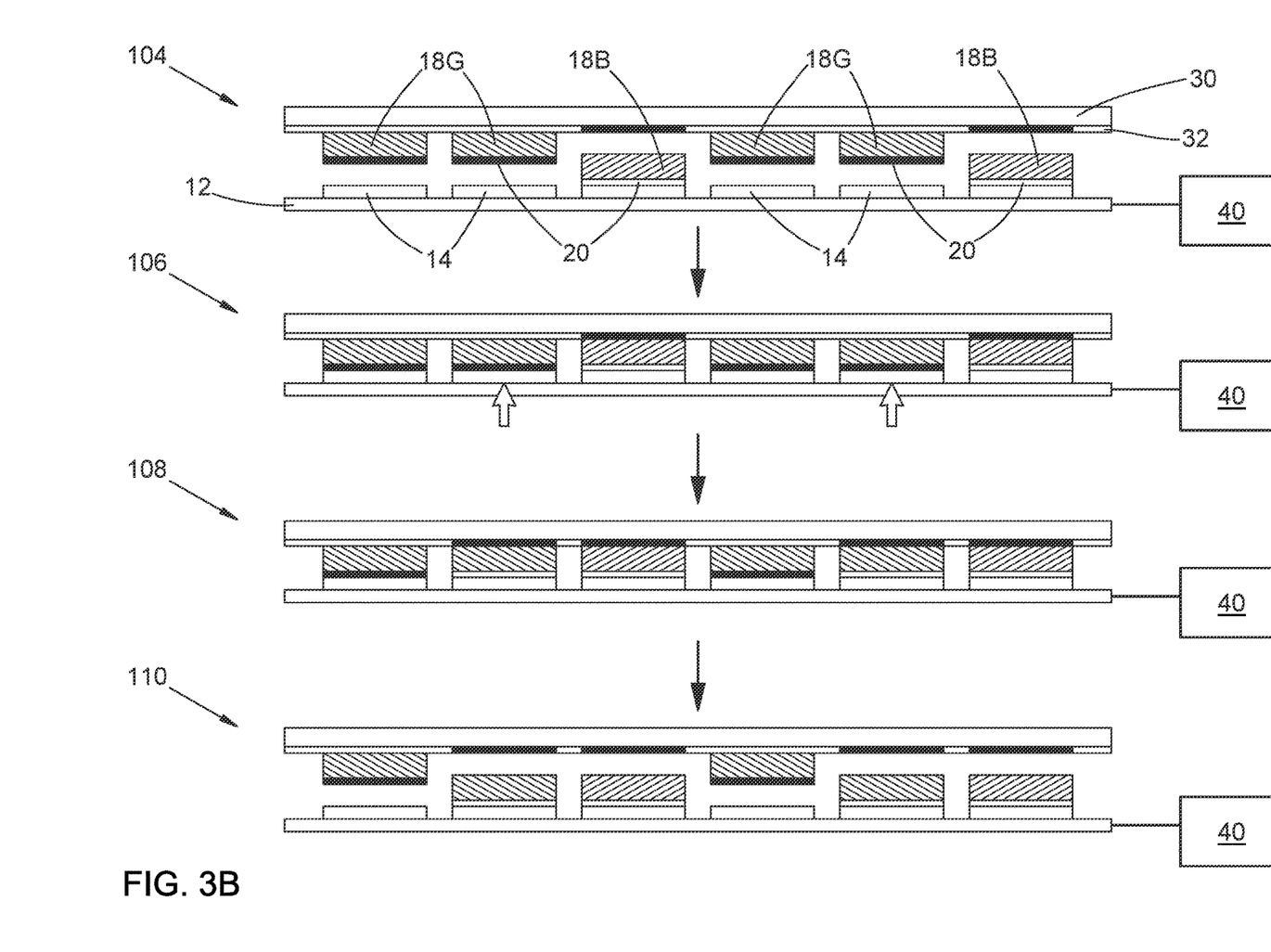
Figure 3C:
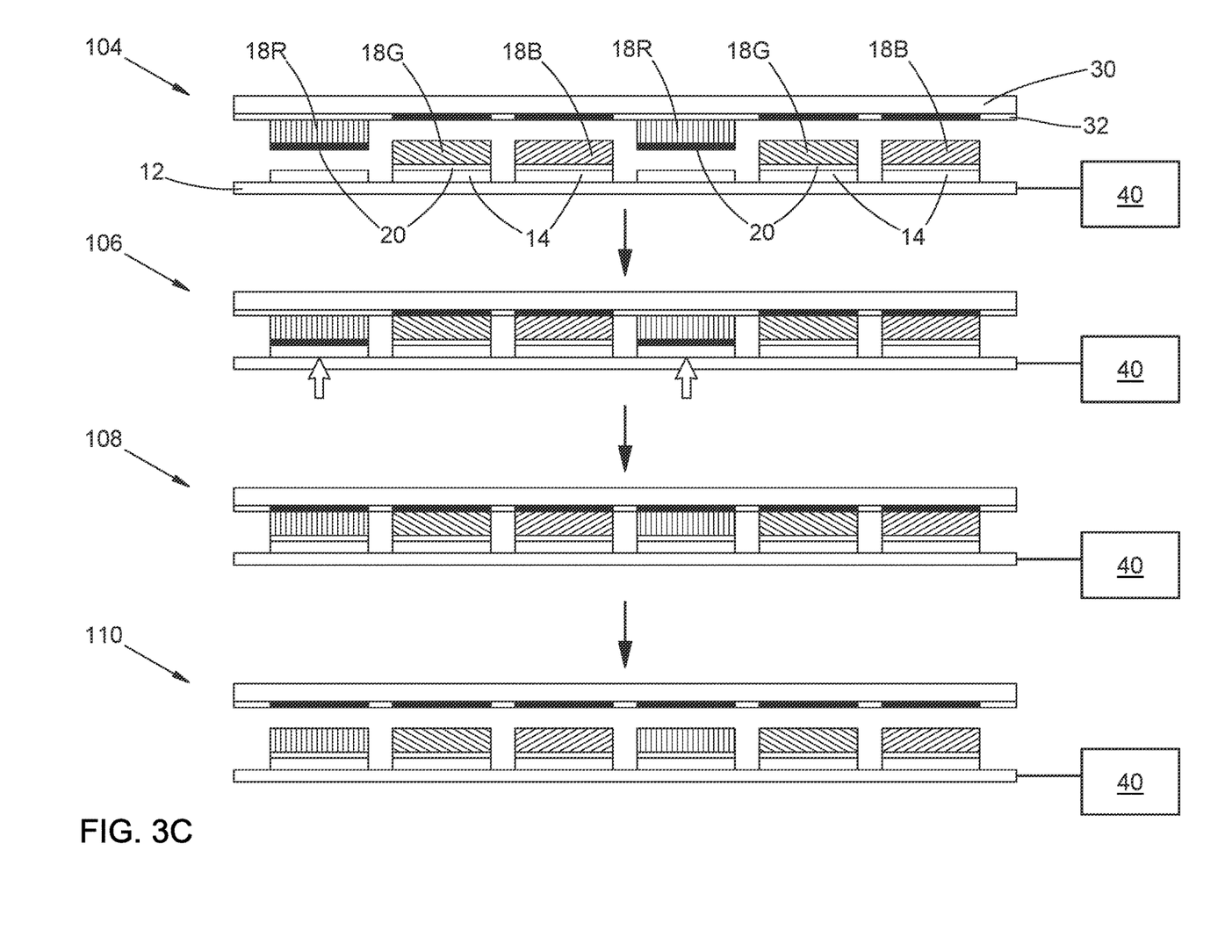

FIG. 2 is a process flowchart for example methods of the invention. FIGS. 3A, 3B, and 3C illustrate three consecutive sequences of the device structure at various stages of each pass of attachment of phosphor pixels 18.

In step 102, a segmented phosphor array is created on a carrier 30 coated with a releasable adhesive 32, e.g. a thermal release layer. This array can be formed by dicing a layer that contains phosphor, or by other methods such as a lithographic or ablation process. The phosphor layer material may be, for example, phosphor/silicone, ceramic phosphor, phosphor in glass, or phosphor on glass: other suitable phosphor materials can be employed. Before or after the phosphor layer segmentation step, the surface of the phosphor layer (or of each phosphor pixel 18) opposite from the surface attached to the carrier 30 is coated with a thermally-activated adhesive 20 (e.g., an LED grade silicone or epoxy adhesive exhibiting low adhesion/G' at room temperature and increased adhesion at higher temperatures).

The carrier 30 may be for example a substrate of PET, sacrificial polymer, glass, or silicon. The releasable adhesive layer 32 may be a thermal or UV activated release adhesive. The thermal or UV release adhesive 32 has a shear storage modulus G'>300 KPa at room temperature, which drops below 300 KPa at given elevated temperature to achieve adhesion with the carrier substrate 30. Suitable layered carrier assemblies, e.g. Nitto Revalpha and Adwill D510, include the substrate 30 and the thermal activated release adhesive 32. The phosphor layer contains a segmented array of phosphor pixels 18 of a single color, and a partially cured or highly viscous silicone adhesive 20 disposed on a surface of the phosphor pixels 18 opposite from the carrier substrate 30.

During mechanical or chemical segmentation, the phosphor layer may be diced into separate M×N arrays such that there are major and minor gaps in the phosphor layer. The major gaps penetrate fully through the carrier 30 to separate the phosphor layer into the arrays (e.g., corresponding to a display pixel that includes multiple semiconductor LED pixels 14). The minor gaps cut through phosphor, but stop in the carrier layer 30, thus creating multiple phosphor pixels 18 in each of the separate arrays.

In step 104, the segmented phosphor array is aligned with a semiconductor LED array so that individual phosphor pixels 18 are aligned with corresponding pixels 14 in the array of semiconductor LEDs. In step 106 the phosphor pixels 18 and LED pixels 14 are placed in contact with and optionally weakly bonded to one another. In step 106, a selected subset of the pixels of the LED array is electrically turned on (e.g., using a control circuit 40). During this operation the surface of the selected LED pixels rapidly heats up, reaching temperatures high enough (e.g., 100° C. to 150° C.) to cause the thermally-activated adhesive 20 between the semiconductor LED pixel 14 and the corresponding phosphor pixel 18 to reflow, creating a strong bond between each selected LED pixel 14 and the corresponding phosphor pixel 18 at step 108. Simultaneously, down-conversion in the phosphor layer results in additional heating of the phosphor pixel 18, reaching temperatures of, e.g., 150° C. to 200° C. This results in the release of that phosphor pixel 18 from the thermal release layer 32 on the carrier 30.

In step 110, the carrier is removed. A corresponding subset of phosphor pixels 18 are bonded to the semiconductor LED pixels 14 that were operated during step 106, while the rest remain on the carrier 30 and are removed from the LED array.

The method described is illustrated schematically in FIG. 3A, which shows a carrier layer 30 with attached blue phosphor pixels 18B aligned over an array of semiconductor LED pixels 14 on the substrate 12. The carrier assembly and semiconductor die are brought together so that the adhesive 20 is between and in contact with each phosphor pixel 18B and the light output surface of each corresponding LED pixel 14. At step 106 certain LED pixels 14 are electrically activated (indicated by the white arrows), e.g., using a control circuit 40, which heats the activated LED pixels 14 and corresponding phosphor pixels 18B. At step 108 the elevated temperature results in curing, or at least partial curing, of the adhesive 20, while releasing the adhesive 32. Note that in the figures solid black layers 20 or 32 indicate uncured, released, or non-adhering adhesive, while white layers 20 or 32 indicate cured or adhering adhesive. At step 110 the carrier substrate 30 is removed. Phosphor pixels 18B remain attached to corresponding LED pixels 14 that were activated at step 106, and are removed from those LED pixels 14 that were not activated.

Steps 102 through 110 can be repeated to attach phosphor pixels 18 of other colors. In the example shown, after attachment of blue phosphor pixels 18B to certain LED pixels 14 in FIG. 3A, in FIG. 3B a carrier substrate with green phosphor pixels 18G is used to attached green phosphor pixels 18G to certain LED pixels 14 that do not already have blue phosphor pixels 18B attached. The carrier 30 has a pattern of phosphor pixels 18G that complements the arrangement of blue phosphor pixels 18B already attached to LED pixels 14. With the green phosphor pixels 18G positioned on the LED pixels 14, certain LED pixels 14 are activated to cure the adhesive 20 and release the adhesive 32. Removing the carrier 30 removes the phosphor pixels 18G from LED pixels that were not activated and leaves phosphor pixels 18G attached to those LED pixels 14 that were activated. The process can be repeated again as in FIG. 3C to attach red phosphor pixels 18R to those pixels not already attached to blue or green phosphor pixels 18B or 18G. The order of colors is only an example; any order can be employed, and different orderings can be advantageously employed for producing the complementary arrangements of phosphor pixels 18 on the carrier 30 that are needed for phosphor pixels 18 of second and subsequent colors to be attached.

Figure 4A:
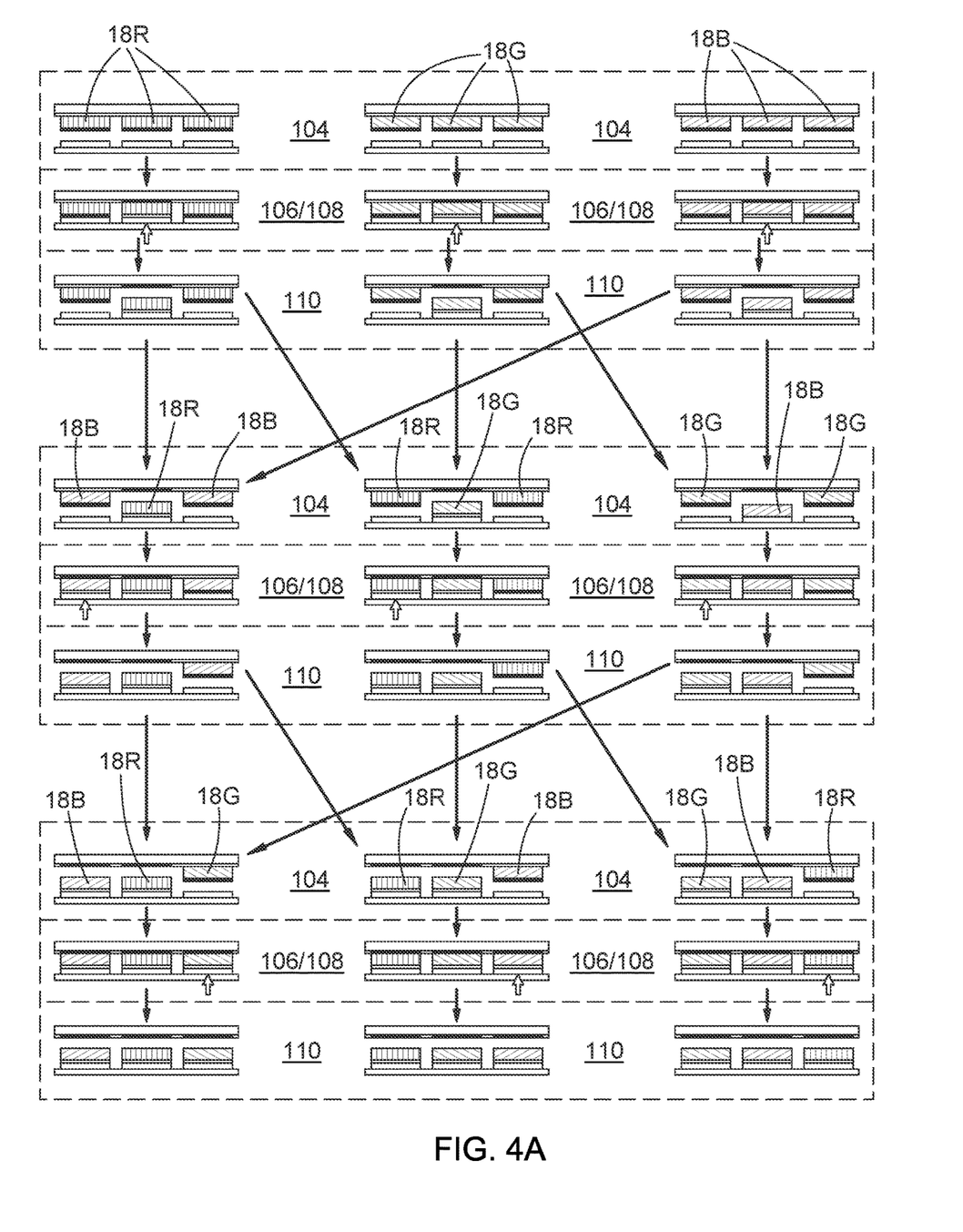
FIGS. 4A and 4B are side cross-sectional and top views, respectively, that schematically illustrate three parallel attachment processes, of the general type illustrated in FIGS. 3A/3B/3C, and use of each substrate carrying phosphor pixels in each of the different parallel processes.
Figure 4B:
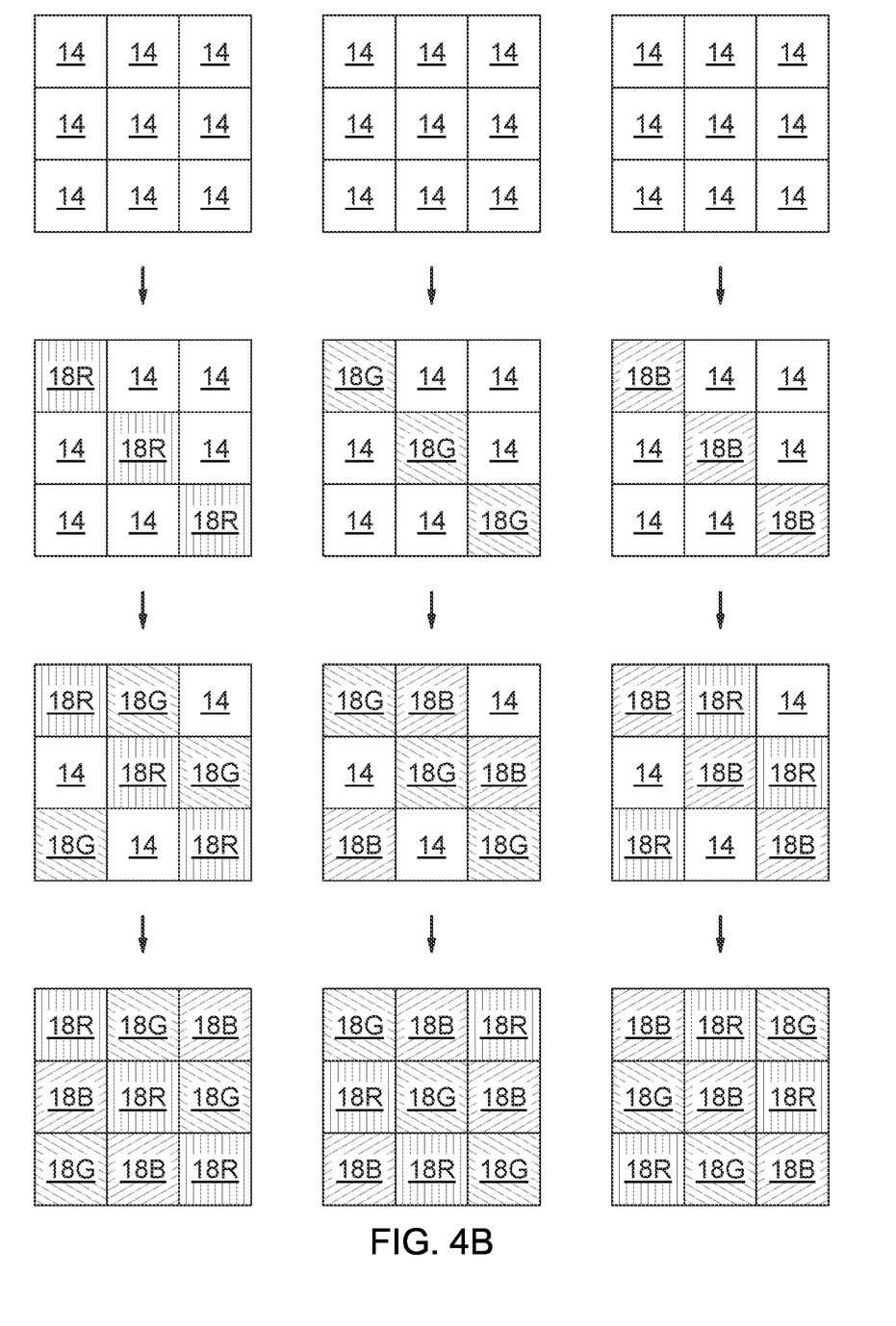

FIGS. 4A and 4B illustrate schematically three parallel phosphor pixel attachment sequences that are each similar to the sequence illustrated in FIGS. 3A through 3C. Phosphor pixels of a first color are attached to certain LED pixels 14 as described above and shown in FIG. 3A (red pixels 18R in the left sequence, green pixels 18G in the center sequence, and blue pixels 18B in the right sequence). After removing the carriers 30 and their remaining phosphor pixels 18, each carrier 30 is shifted to a different sequence (indicated by the diagonal arrows in FIG. 4A), where its pattern of missing phosphor pixels 18 (those left behind attached to LED pixels 14) is the complementary pattern needed for attachment of a second color to an LED array already having that same arrangement of attached phosphor pixels 18. After attachment of phosphor pixels 18 of a second color to certain LED pixels 14 as described above and shown in FIG. 3B, the carriers 30 are shifted again for attaching phosphor pixels of a third color, as shown in FIG. 3C.

Figure 1B:
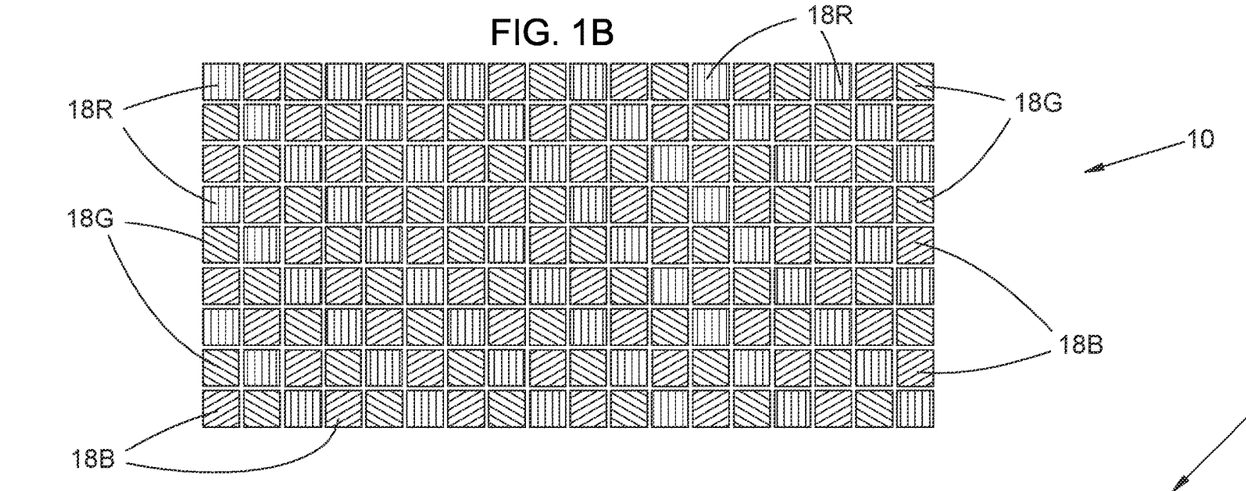
FIG. 1B is a schematic top view of a portion of an example LED display in which each display pixel is a red, green, or blue phosphor-converted LED pixel.
Figure 1C:
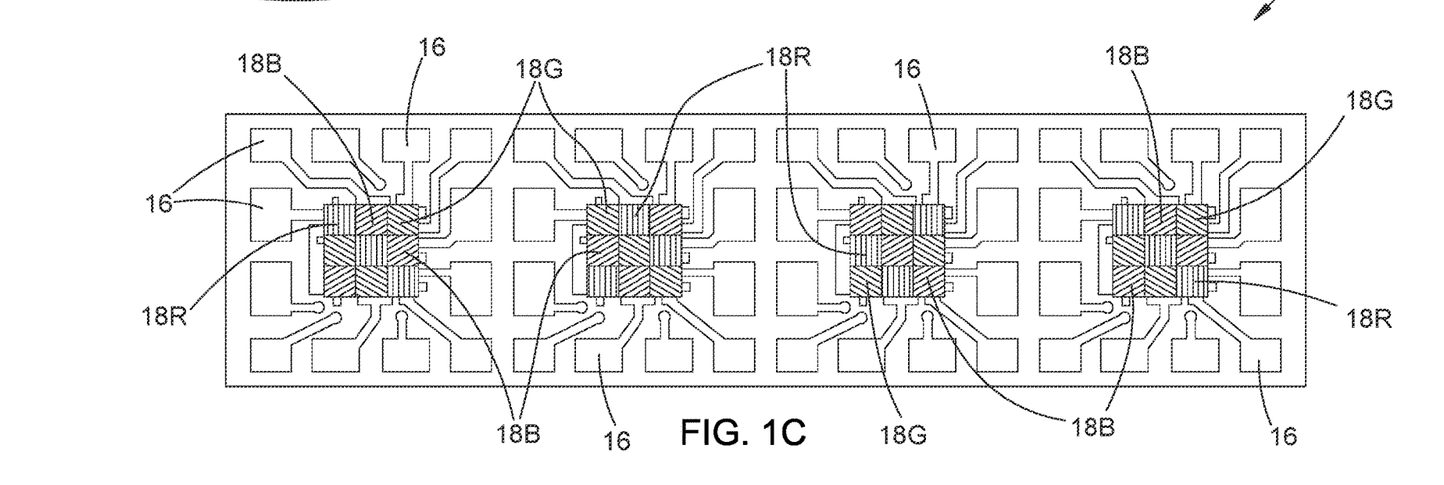
FIG. 1C is a schematic top view of a portion of an example LED display in which each display pixel includes multiple phosphor-converted LED pixels (red, green, and blue) integrated onto a single die that is bonded to a control circuit backplane.

The top view shown in FIG. 4B illustrates an example of a sequence of phosphor pixel arrangements that result from the sequences of FIG. 4A, and resemble the example shown in FIG. 1B. Beginning with a bare 3×3 array of semiconductor LED pixels 14, phosphor pixels of a first color are attached as described above in a first pattern (diagonal in this example); the first pattern is the same for three different first colors on three different LED arrays. After that first color attachment sequence, each array of phosphor pixels 18 is left with gaps corresponding to those pixels left behind, and can now fit onto one of the other LED arrays that has a first color attached. Phosphor pixels 18 of a second color are attached as described above in a second pattern; the second pattern is the same for three different second colors on the three different LED arrays. With removal of a second set of phosphor pixels 18, each carrier can now fit over attached phosphor pixels 18 of the two previously attached colors. At the end, in some examples the entire LED array can be covered with phosphor pixels 18 (as shown). In other examples (not shown), some LED pixels 14 can be left without a corresponding phosphor pixel 18; such an arrangement can be suitable, e.g., when the direct output of the LED pixel 14 is one of the desired colors for the display. Although 3×3 LED arrays are shown in the examples, the disclosed methods can be employed to produce multi-color phosphor converted LED arrays of any size or number of pixels.

In one specific example, a silicone/phosphor film is fully cured and then laminated onto a PET substrate 30 coated with a thermal release adhesive 32. A thin layer of silicone adhesive 20 is deposited onto the phosphor film surface, e.g., via spin-coating, after which excess solvent is removed with a short bake step. The phosphor film/PET stack is then diced into 3×3 arrays, where every third saw line cuts fully through the PET to singulate the arrays (other saw lines cut through phosphor, but stop in PET layer). The arrays are then aligned and attached onto a pixelated TFFC die using a pick-and-place tool. No elevated temperature or force is used during the attach process, leading to a weak bond between the die and the silicone adhesive on the phosphor pixels 18. Electrical contact is then made to power a selected pattern of die LED pixels 14, which are run at a set current for a certain length of time (in the case of devices shown in FIG. 4, 4 A/mm² for 15 seconds). A tape is laminated to the top of the PET carrier 30 and then used to remove the PET carrier 30 and un-bonded phosphor pixels 18.

As noted above, in some examples the release adhesive 32 can be UV-releasable. A UV-releasable adhesive 32 can be employed in examples wherein the light output of the semiconductor LED pixels 14 is of a wavelength suitable for releasing the adhesive, e.g., a UV GaN LED.

Figure 5A:
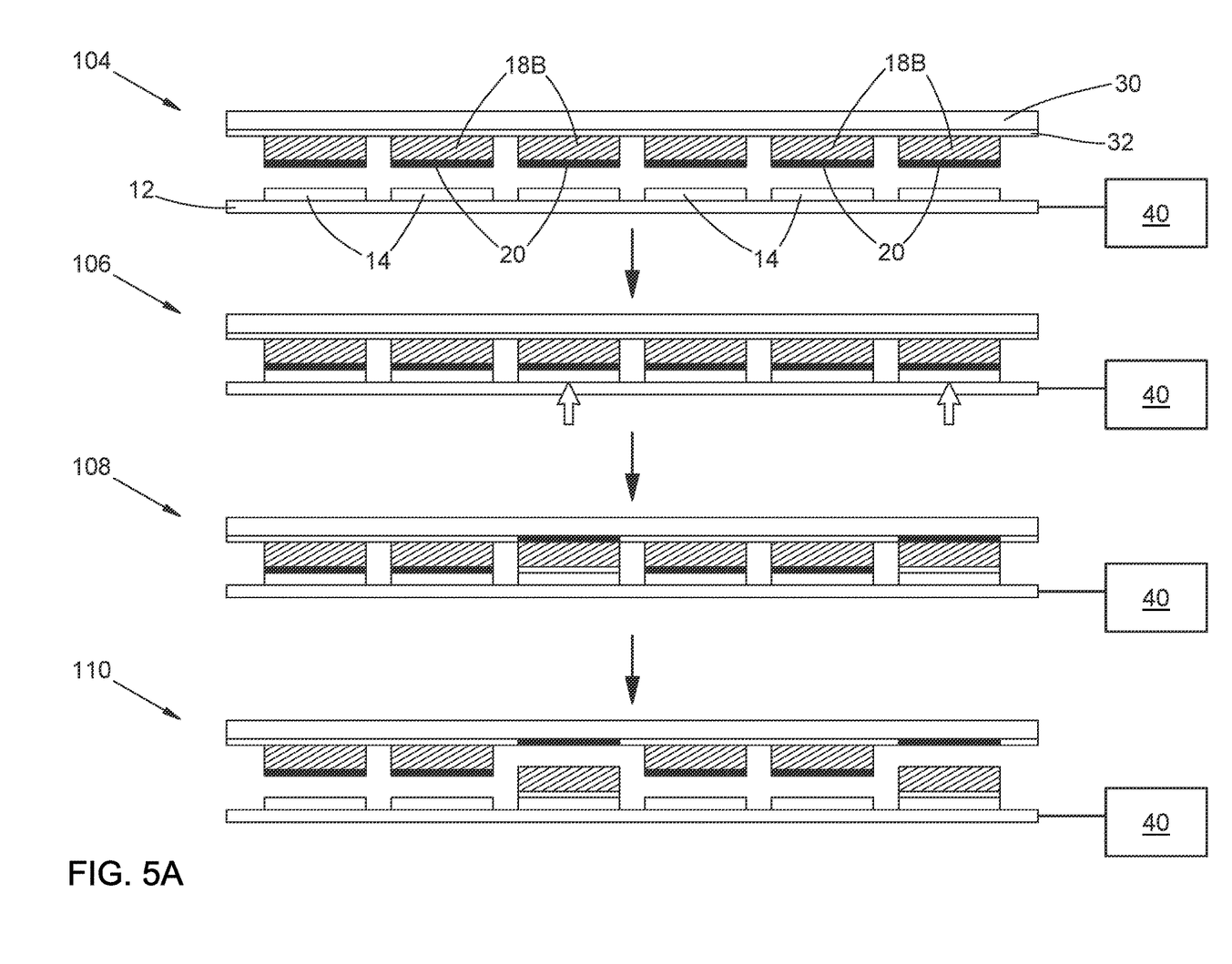
FIGS. 5A, 5B, and 5C are analogous to FIGS. 3A, 3B, and 3C but show phosphor pixels of differing colors having differing thicknesses.
Figure 5B:
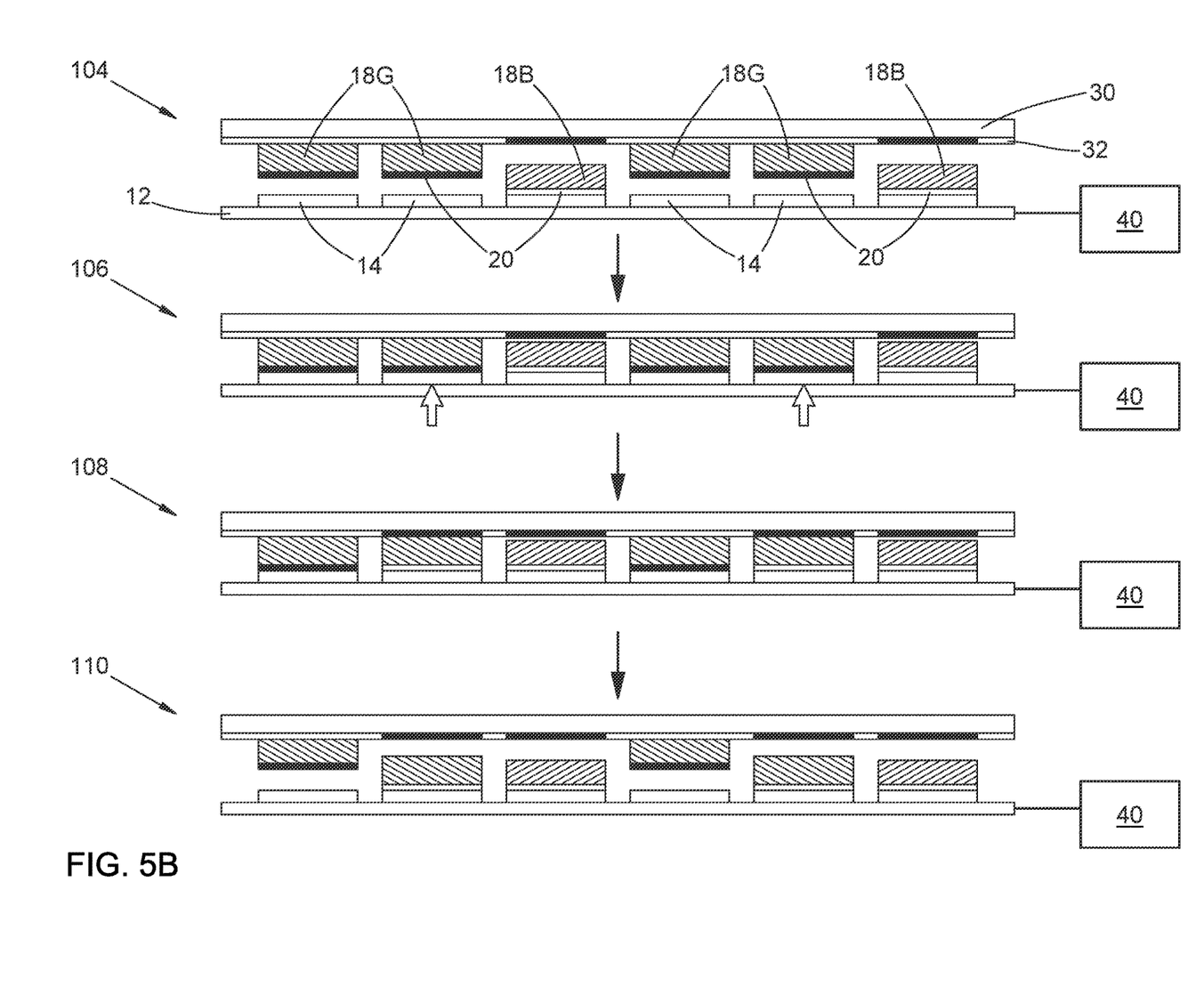
Figure 5C:
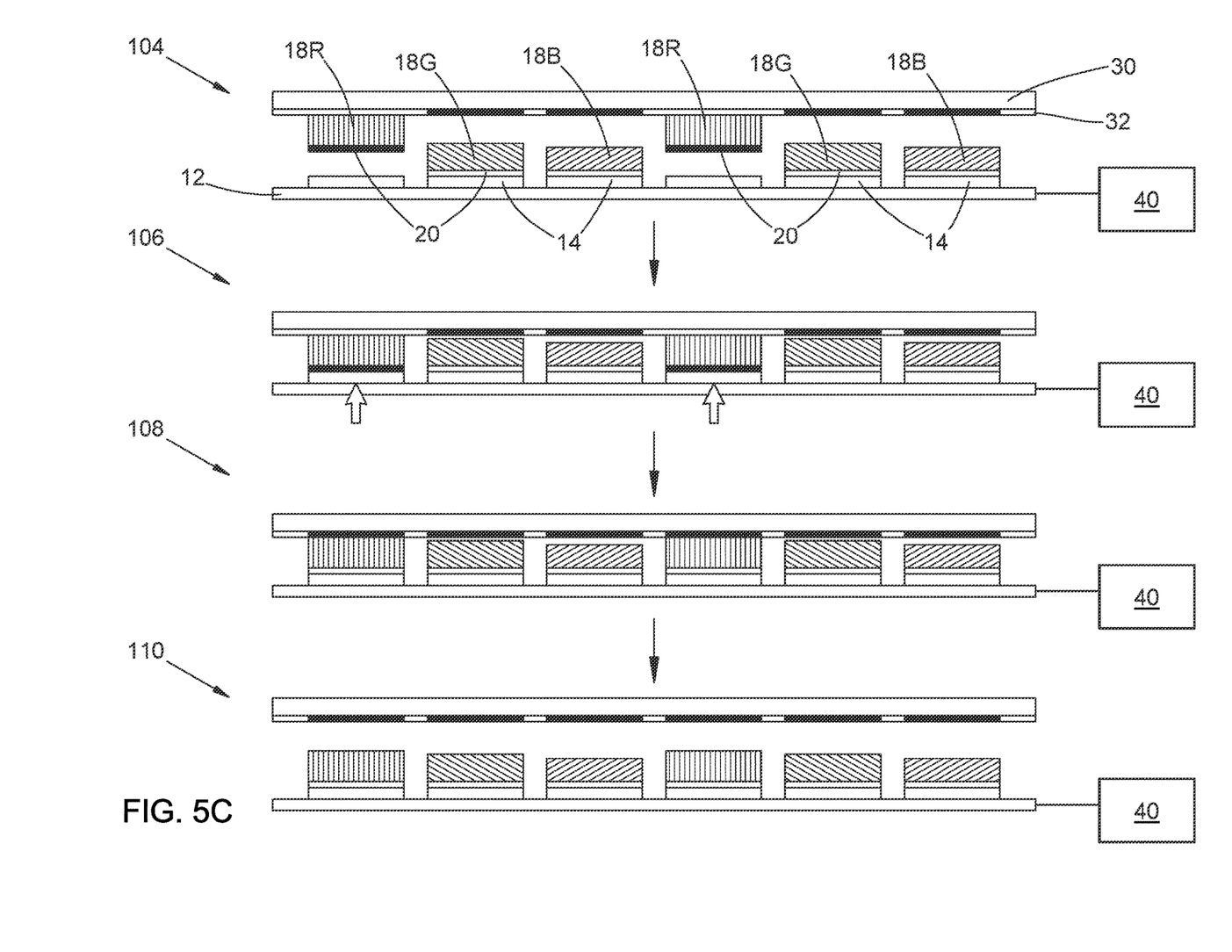

The phosphor pixel attachment sequences shown in FIGS. 5A through 5C are analogous to those of FIGS. 3A through 3C, except that phosphor pixels 18 of different colors have different thicknesses. Such thickness difference might arise in some examples due to different optical characteristics of different phosphors (e.g., absorption coefficient or conversion efficiency). In some examples, differing thicknesses can facilitate the phosphor attachment sequences disclosed herein. If the different colored phosphor pixels 18 are attached in order of thinnest to thickest (as in FIGS. 5A-5C), then at each subsequent attachment stage there is a gap between the carrier substrate 30 and phosphor pixels 18 already attached to the corresponding LED pixels 14. That can be advantageous, e.g., to ensure that subsequently attached phosphor pixels 18 can make contact with the corresponding LED pixels (i.e., without interference from a too-thick phosphor pixel 18 already attached to an LED pixel 14), or to avoid potentially undesirable contact between an attached phosphor pixel 18 and the carrier 30 or release adhesive residue thereon.

Although the thermally-released carrier 30 is removed at the end of the attach process, the disclosed inventive methods result in a discrete segment of the thermally activated adhesive layer 20 between each attached phosphor pixel 18 and the light output surface of the corresponding semiconductor LED pixel 14. Each adhesive layer segment 20 is separated from other such segments between other pairs of phosphor and LED pixels 18 and 14. The presence of such discrete adhesive layer segments 20 and the fully aligned segmentation of both the adhesive layer 20 and the phosphor pixels 18 (i.e., aligned with the underlying LED pixels 14) can indicate the use of the disclosed inventive methods. Other indicators of those methods may include the different thicknesses (i.e., heights) of the phosphor pixels depending on the number of attachment steps used to attach phosphor pixels of different colors. Finally, the metal traces/tie bars used to electrically activate the appropriate pixels during the attach process also can be indicative of the use of the disclosed inventive methods.

This disclosure is illustrative and not limiting. Further modifications will be apparent to one skilled in the art in light of this disclosure and are intended to fall within the scope of the appended claims. One of skill can extend the disclosed inventive apparatus and methods to vertical thin film (VTF) and similar LED architectures, In addition to the preceding, the following example embodiments fall within the scope of the present disclosure or appended claims:

Example 1. A light emitting apparatus comprising: (a) a semiconductor LED array comprising multiple semiconductor LED pixels; (b) multiple corresponding phosphor pixels of multiple different colors, with each phosphor pixel being positioned over a light emitting surface of a corresponding one of the semiconductor LED pixels; and (c) between each phosphor pixel and the corresponding semiconductor LED pixel, a corresponding discrete segment of thermally cured adhesive that attaches the phosphor pixel to the corresponding semiconductor LED pixel, each discrete segment of thermally cured adhesive being separated from other discrete segments of thermally cured adhesive between other phosphor pixels and corresponding semiconductor LED pixels of the array.

Example 2. The light emitting apparatus of Example 1, further comprising one or more metal traces or tie bars arranged and connected so as to enable selective electrical operation of selected ones of the semiconductor LED pixels.

Example 3. The light emitting apparatus of any one of Examples 1 or 2, wherein the phosphor pixels exhibit differing thicknesses.

Example 4. The light emitting apparatus of any one of Examples 1 through 3, wherein the thermally cured adhesive exhibits a cure temperature between about 100° C. and about 150° C.

Example 5. The light emitting apparatus of any one of Examples 1 through 4, wherein the thermally cured adhesive is a silicone.

Example 6. The light emitting apparatus of any one of Examples 1 through 5, wherein the thermally cured adhesive has a refractive index between about 1.4 and about 1.6.

Example 7. The light emitting apparatus of any one of Examples 1 through 6, wherein the phosphor pixels include one or more of phosphor/silicone, ceramic phosphor, phosphor in glass, or phosphor on glass.

Example 8. A method for making the light emitting apparatus of any one of Examples 1 through 7, the method comprising: (A) positioning the phosphor structure on the semiconductor LED array, with each phosphor pixel aligned with a corresponding semiconductor LED pixel of the array, and with a corresponding segment of the adhesive between and in contact with each phosphor pixel and the light output surface of the corresponding semiconductor LED pixel; and (B) electrically operating selected ones of the semiconductor LED pixels to emit light and to heat the corresponding phosphor pixels to a temperature that at least partially cures corresponding discrete segments of the adhesive and bonds each one of the selected semiconductor LED pixels to the corresponding phosphor pixel.

Example 9. A method for making a light emitting apparatus, the method comprising: (A) positioning on a semiconductor LED array comprising multiple semiconductor LED pixels a phosphor structure comprising multiple phosphor pixels with each phosphor pixel aligned with a corresponding semiconductor LED pixel of the array, the phosphor structure having a layer of thermally curable adhesive thereon so that, with the phosphor structure positioned on the semiconductor LED array, a corresponding segment of the adhesive is between and in contact with each phosphor pixel and a light output surface of the corresponding semiconductor LED pixel; and (B) electrically operating selected ones of the semiconductor LED pixels to emit light and to heat the corresponding phosphor pixels to a temperature that at least partially cures corresponding discrete segments of the adhesive and bonds each one of the selected semiconductor LED pixels to the corresponding phosphor pixel.

Example 10. The method of Example 9, wherein the thermally cured adhesive exhibits a cure temperature between about 100° C. and about 150° C.

Example 11. The method of any one of Examples 9 or 10, wherein the thermally cured adhesive is a silicone.

Example 12. The method of any one of Examples 9 through 11, wherein the thermally cured adhesive has a refractive index between about 1.4 and about 1.6.

Example 13. The light emitting apparatus of any one of Examples 9 through 12, wherein the phosphor layer includes one or more of phosphor/silicone, ceramic phosphor, phosphor in glass, or phosphor on glass.

Example 14. The method of any one of Examples 9 through 13, wherein (i) the phosphor structure includes a substrate, (ii) surfaces of the phosphor pixels opposite from the semiconductor LED array are attached to the substrate by a thermally releasable adhesive, and (iii) operating the selected ones of the semiconductor LED pixels to emit light and to heat the corresponding phosphor pixels releases the corresponding phosphor pixels from the substrate.

Example 15. The method of Example 14, wherein the thermally releasable adhesive exhibits a release temperature between about 150° C. and about 220° C.

Example 16. The method of any one of Examples 14 or 15, further comprising removing from the semiconductor LED array the substrate and those phosphor pixels not released from the substrate.

Example 17. The method of any one of Examples 9 through 13, wherein (i) the phosphor structure includes a substrate, (ii) surfaces of the phosphor pixels opposite from the semiconductor LED array are attached to the substrate by a UV releasable adhesive, and (iii) operating the selected ones of the semiconductor LED pixels to emit UV light releases the corresponding phosphor pixels from the substrate.

Example 18. The method of Example 17, further comprising removing from the semiconductor LED array the substrate and those phosphor pixels not released from the substrate.

Example 19. The method of any one of Examples 9 through 18, wherein the phosphor pixels of the phosphor structure are all of a first color, the method further comprising: (C) positioning on the semiconductor LED array and the bonded phosphor pixels of the first color a second phosphor structure comprising multiple phosphor pixels all of a second color different from the first color, with each phosphor pixel of the second color aligned with a corresponding semiconductor LED pixel of the array that is not bonded to a phosphor pixel of the first color, the second phosphor structure having a layer of thermally curable adhesive thereon so that, with the second phosphor structure position on the semiconductor LED array, a corresponding segment of the adhesive is between and in contact with each phosphor pixel of the second color and the corresponding semiconductor LED pixel; and (D) electrically operating selected ones of the semiconductor LED pixels to emit light and to heat the corresponding phosphor pixels of the second color to a temperature that at least partially cures corresponding discrete segments of the adhesive and bonds each of the selected semiconductor LED pixels to the corresponding phosphor pixel of the second color.

Example 20. The method of Example 19, wherein (i) the second phosphor structure includes a second substrate, (ii) surfaces of the phosphor pixels of the second color opposite from the semiconductor LED array are attached to the second substrate by a thermally releasable adhesive, and (iii) operating the selected ones of the semiconductor LED pixels to emit light and to heat the corresponding phosphor pixels of the second color releases the corresponding phosphor pixels of the second color from the second substrate.

Example 21. The method of Example 20, further comprising removing from the semiconductor LED array the second substrate and those phosphor pixels of the second color not released from the second substrate.

Example 22. The method of Example 19, wherein (i) the second phosphor structure includes a second substrate, (ii) surfaces of the phosphor pixels of the second color opposite from the semiconductor LED array are attached to the second substrate by a UV releasable adhesive, and (iii) operating the selected ones of the semiconductor LED pixels to emit UV light releases the corresponding phosphor pixels of the second color from the second substrate.

Example 23. The method of Example 22, further comprising removing from the semiconductor LED array the second substrate and those phosphor pixels of the second color not released from the second substrate.

Example 24. The method of any one of Examples 19 through 23, wherein the phosphor pixels of the second color are thicker than the phosphor pixels of the first color.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without any dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without any dogs, or (iv) one or more dogs, one or more cats, and one or more mice; "three or more," "four or more," and so on would be analogously interpreted.

For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A method for making a light emitting apparatus, the method comprising:
    positioning on a semiconductor LED array comprising multiple semiconductor LED pixels a first set of phosphor pixels arranged on a carrier substrate, with each phosphor pixel of the first set aligned with a corresponding semiconductor LED pixel of the array, the phosphor pixels of the first set having a layer of thermally curable adhesive, in an uncured state, on a surface thereof opposite the carrier substrate so that a corresponding segment of the adhesive is between and in contact with each phosphor pixel of the first set and a light output surface of the corresponding semiconductor LED pixel; and
    electrically operating selected ones of the semiconductor LED pixels to emit light and to heat the corresponding phosphor pixels to a temperature that at least partially cures corresponding discrete segments of the adhesive and bonds each one of the selected semiconductor LED pixels to the corresponding phosphor pixel of the first set.

2. The method of claim 1, further comprising separating the carrier substrate from the LED array, each phosphor pixel of the first set that is bonded to a corresponding one of the LED pixels remaining on the corresponding LED pixel, while other phosphor pixels of the first set remain on the carrier substrate.

3. The method of claim 1, the thermally curable adhesive having a cure temperature between about 100° C. and about 150° C.

4. The method of claim 1, the thermally curable adhesive including a silicone.

5. The method of claim 1, the thermally curable adhesive has a refractive index between about 1.4 and about 1.6.

6. The method of claim 1, the phosphor layer including one or more of phosphor/silicone, ceramic phosphor, phosphor in glass, or phosphor on glass.

7. The method of claim 1, the phosphor pixels of the first set being attached to the carrier substrate by a UV releasable adhesive, wherein operating the selected ones of the semiconductor LED pixels to emit UV light releases the corresponding phosphor pixels from the substrate.

8. The method of claim 7, further comprising separating the carrier substrate from the LED array, each phosphor pixel of the first set that is bonded to a corresponding one of the LED pixels remaining on the corresponding LED pixel, while other phosphor pixels of the first set remain on the carrier substrate, each area of the carrier substrate from which a phosphor pixel was removed having thereon a layer of the UV releasable adhesive in a released state.

9. The method of claim 1, the phosphor pixels of the first set being attached to the carrier substrate by a thermally releasable adhesive, wherein operating the selected ones of the semiconductor LED pixels to emit light and to heat the corresponding phosphor pixels of the first set releases those corresponding phosphor pixels from the carrier substrate.

10. The method of claim 9, the thermally releasable adhesive having a release temperature between about 150° C. and about 220° C.

11. The method of claim 9, further comprising separating the carrier substrate from the LED array, each phosphor pixel of the first set that is bonded to a corresponding one of the LED pixels remaining on the corresponding LED pixel, while other phosphor pixels of the first set remain on the carrier substrate, each area of the carrier substrate from which a phosphor pixel was removed having thereon a layer of the thermally releasable adhesive in a released state.

12. The method of claim 1:
the LED array having a second set of multiple phosphor pixels;
each phosphor pixel of the second set being positioned over a light output surface of a corresponding one of a first subset of the LED pixels and attached to that corresponding LED pixel by the thermally curable adhesive in a cured state;
a second subset of the LED pixels having no corresponding phosphor pixel of the second set attached thereto; and
the phosphor pixels of the first and second sets being arranged on the carrier substrate and the LED array, respectively, so that with the phosphor pixels of the first set positioned on the LED array, (i) each phosphor pixel of the first set is aligned with a corresponding one of the LED pixels that lacks a phosphor pixel of the second set, and (ii) each phosphor pixel of the second set is aligned with a corresponding area of the carrier substrate that lacks a phosphor pixel of the first set.

13. The method of claim 12, the phosphor pixels of the second set including phosphor pixels of one or more colors, the phosphor pixels of the first set including phosphor pixels of at least one color different from the color of any phosphor pixel of the second set.

14. The method of claim 13, the phosphor pixels of the first set being all a single color.

15. The method of claim 14, the phosphor pixels of the second set being all a single color.

16. The method of claim 14, the phosphor pixels of the second set including at least two different colors.

17. The method of claim 14, the phosphor pixels of the second set including at least three different colors.

18. The method of claim 12, the phosphor pixels of the second set having corresponding thicknesses less than thickness of any phosphor pixel of the first set.

* * * * *